(12) United States Patent
Thian et al.

(10) Patent No.: US 9,203,384 B2
(45) Date of Patent: Dec. 1, 2015

(54) CLOCK ADJUSTMENT CIRCUIT AND DIGITAL TO ANALOG CONVERTING DEVICE

(71) Applicant: Phisontech Electronics (Malaysia) Sdn Bhd., Penang (MY)

(72) Inventors: Nyuk-How Thian, Sarawak (MY); Chih-Jen Hsu, Hsinchu County (TW)

(73) Assignee: Phisontech Electronics (Malaysia) Sdn Bhd., Penang (MY)

( * ) Notice: Subject to any disclaimer, the term of this patent is extended or adjusted under 35 U.S.C. 154(b) by 0 days.

(21) Appl. No.: 14/277,004

(22) Filed: May 13, 2014

(65) Prior Publication Data

US 2015/0236682 A1 Aug. 20, 2015

(30) Foreign Application Priority Data

Feb. 20, 2014 (MY) .............................. PI 2014000466

(51) Int. Cl.
*H03M 1/66* (2006.01)
*H03K 5/04* (2006.01)
*H03K 5/00* (2006.01)

(52) U.S. Cl.
CPC .............. *H03K 5/04* (2013.01); *H03K 5/00006* (2013.01); *H03M 1/66* (2013.01)

(58) Field of Classification Search
CPC ........ H03K 5/04; H03K 5/00006; H03M 1/66
USPC .................................................. 341/166, 144
See application file for complete search history.

(56) References Cited

U.S. PATENT DOCUMENTS

| | | | |
|---|---|---|---|
| 8,487,671 B2 * | 7/2013 | Miyano .......................... | 327/141 |
| 8,675,742 B2 * | 3/2014 | Zhang ............................ | 375/259 |
| 8,706,073 B2 * | 4/2014 | Borsella et al. ............. | 455/343.1 |
| 8,731,003 B2 * | 5/2014 | Laamanen et al. ............ | 370/507 |

* cited by examiner

*Primary Examiner* — Brian Young
(74) *Attorney, Agent, or Firm* — Jianq Chyun IP Office

(57) ABSTRACT

A clock adjustment circuit and a digital to analog converting device are provided. The clock adjustment circuit includes a selection circuit and a frequency decreasing circuit. The selection circuit is configured to generate a first selection signal in response to a frequency of an output clock signal. The frequency decreasing circuit is coupled to the selection circuit, and configured to generate the output clock signal by reducing a frequency of an input clock signal by a first ratio in response to a first level of the first selection signal, and configured to generate the output clock signal by reducing the frequency of the input clock signal by a second ratio in response to a second level of the first selection signal, wherein the first ratio is different from the second ratio. Accordingly, complexity of a circuit is reduced.

16 Claims, 3 Drawing Sheets

CLOCK ADJUSTMENT CIRCUIT AND DIGITAL TO ANALOG CONVERTING DEVICE

CROSS-REFERENCE TO RELATED APPLICATION

This application claims the priority benefit of Malaysian application serial no. PI 2014000466, filed on Feb. 20, 2014. The entirety of the above-mentioned patent application is hereby incorporated by reference herein and made a part of this specification.

BACKGROUND

1. Technology Field

The invention generally relates to a clock adjustment circuit, and in particular, to a digital clock adjustment circuit and a digital to analog converting device using the same.

2. Description of Related Art

Among some digital to analog converting devices, a phase lock loop is usually configured to generate a clock signal, and the clock signal may serve for the modulation or for the sampling of the digital to analog converting process. In some applications, the noise immunity of an all digital phase lock loop is better than that of an analog phase lock loop. The all digital phase lock loop often includes a phase detector, a time to digital converter (TDC), a digital control oscillator, and a divider. To achieve less jitter, the phase detector and/or the digital control oscillator need to have a higher resolution or precision, but that will increase the complexity or the cost of the circuit accordingly. Therefore, it is a topic concerned by those skilled in the art to design a circuit achieving the function of the all digital phase lock loop with lower circuit complexity.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, an embodiment of the invention provides a clock adjustment circuit and a digital to analog converting device to reduce the complexity of the circuit.

In an exemplary embodiment of the invention, a clock adjustment circuit is provided to generate an output clock signal by tracking an input clock signal. The clock adjustment circuit comprises a selection circuit and a frequency decreasing circuit. The selection circuit is configured to generate a first selection signal in response to the frequency of the output clock signal. The frequency decreasing circuit is coupled to the selection circuit, configured to generate the output clock signal by reducing the frequency of the input clock signal by a first ratio in response to a first level of a first selection signal, and configured to generate the output clock signal by reducing the frequency of the input clock signal by a second ratio in response to a second level of the first selection signal. Wherein the first ratio is different from the second ratio.

In an exemplary embodiment of the invention, a digital to analog converting device is provided to receive an input clock signal. The digital to analog converting device includes a clock adjustment circuit, a signal processing circuit, and a digital to analog converter. The clock adjustment circuit includes a selection circuit and a frequency decreasing circuit. The selection circuit is configured to generate a first selection signal in response to the frequency of an output clock signal. The frequency decreasing circuit is coupled to the selection circuit, configured to generate the output clock signal by reducing the frequency of the input clock signal by a first ratio in response to a first level of a first selection signal, and configured to generate the output clock signal by reducing the frequency of the input clock signal by a second ratio in response to a second level of the first selection signal. Wherein, the first ratio is different from the second ratio. The signal processing circuit is coupled to the clock adjustment circuit, and configured to generate at least one first clock signal according to the output clock signal. The digital to analog converter is coupled to the signal processing circuit, and configured to transform the first digital signal to a modulation signal according to the first clock signal.

Based on the above, the clock adjustment circuit and the digital to analog converting device provided in the exemplary embodiments of the invention may achieve the function of the all digital phase lock loop by using the counter, the divider, and the multiplexer to reduce the complexity of the circuit accordingly.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention comprehensible, several exemplary embodiments accompanied with figures are described in detail below.

DESCRIPTION OF THE EMBODIMENTS

Figure 1:
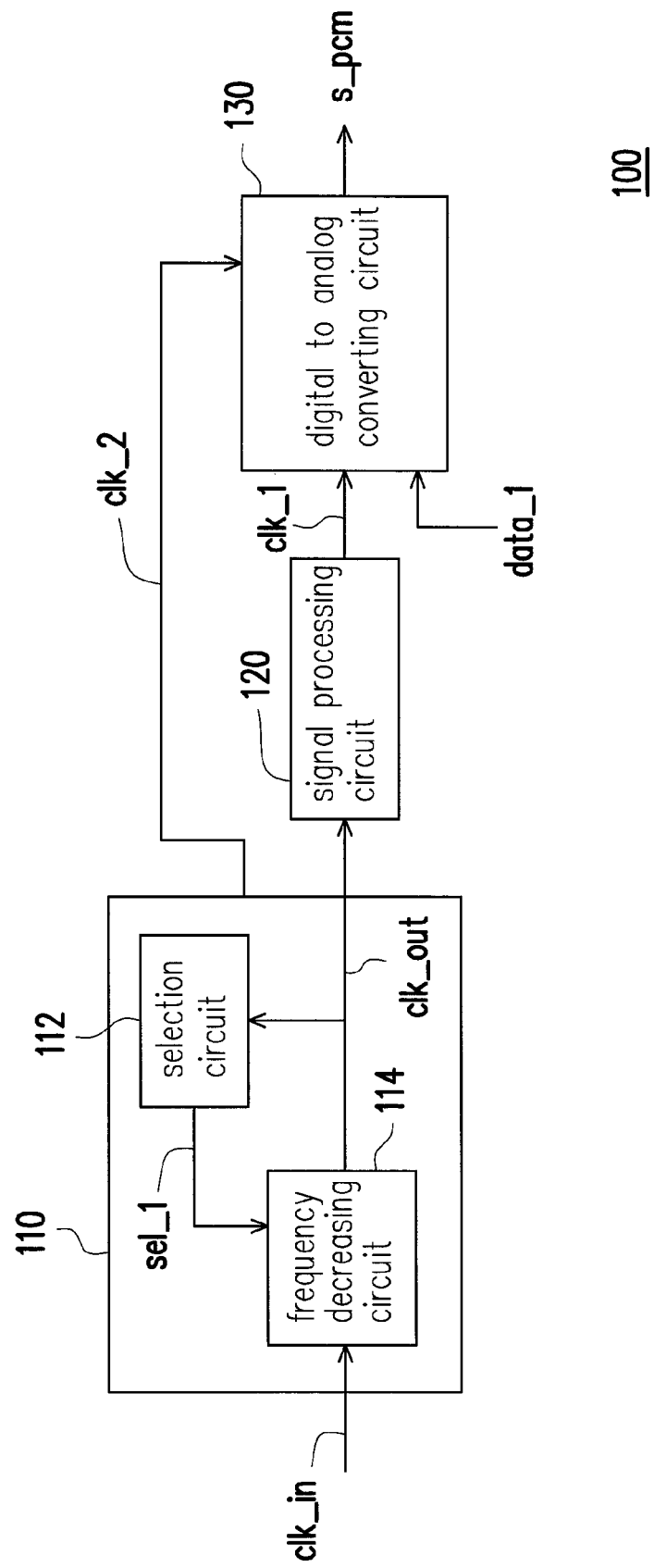
FIG. 1 is a block diagram illustrating a digital to analog converting device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" may be used interchangeably herein.

FIG. 1 is a block diagram illustrating a digital to analog converting device according to an exemplary embodiment of the invention.

Please referring to FIG. 1, a digital to analog converting device 100 includes a clock adjustment circuit 110, a signal processing circuit 120, and a digital to analog converting circuit 130. In the exemplary embodiment, the digital to analog converting device 100 is implemented as an audio signal processing device which is configured to transform a first digital signal data_1 to an analog signal, where the content of the first digital signal data_1 may be audio. However, in the other exemplary embodiments, the digital to analog converting device 100 may also be configured to transform digital signals having the other types to the analog signals. The contents of the first digital signal data_1 are not restricted in the invention.

The clock adjustment circuit 110 is configured to receive an input clock signal clk_in from another electronic device and generate an output clock signal clk_out by tracking the frequency of the input clock signal clk_in. For example, the clock adjustment circuit 110 may be implemented as an all-digital phase locked loop (ADPLL), but the invention is not limited thereto.

The signal processing circuit 120 is coupled to the clock adjustment circuit 110, and configured to generate at least one first clock signal clk_1 according to the output clock signal clk_out. For example, the signal processing circuit 120 includes one or a plurality of dividers to generate the first clock signal clk_1 by reducing the frequency of the output clock signal clk_out.

The digital to analog converting circuit 130 is configured to transform the first digital data data_1 to a modulation signal S_pcm according to the first clock signal clk_1, and the modulation signal S_pcm serves to generate an analog signal. However, the modulation approach used by the digital to analog converting circuit 130 is not restricted in the invention, and how to transform the modulation signal S_pcm to the analog signal is not restricted in the invention either.

For details, the clock adjustment circuit 110 includes a selection circuit 112 and a frequency decreasing circuit 114. The selection circuit 112 is configured to generate a first selection signal sel_1 in response to the frequency of the output clock signal clk_out, such that the first selection signal sel_1 switches between a first level and a second level. The frequency decreasing circuit 114 is coupled to the selection circuit 112, and configured to generate the output clock signal clk_out by reducing the frequency of the input clock signal clk_in by a first ratio in response to the first level of the first selection signal sel_1. If the first selection signal sel_1 is at the second level, the frequency decreasing circuit 114 generates the output clock signal clk_out by reducing the frequency of the input clock signal clk_in by the second ratio in response to the second level of the first selection signal sel_1, wherein the first ratio is different from the second ratio. For example, if the first ratio is 5, it serves to divide the frequency of the input clock signal clk_in by 5, and if the second ratio is 4, it serves to divide the frequency of the input clock signal clk_in by 4. However, the values of the first ratio and the second ratio are not restricted in the invention; alternatively, the first ratio and the second ratio may be floating numbers. In the aforementioned embodiment, the frequency (also be called the first frequency) of the output clock signal clk_out generated by the first ratio is lower than the frequency (also be called the second frequency) of the output clock signal clk_out generated by the second ratio. Therefore, the frequency of the output clock signal clk_out is between the first frequency and the second frequency, and conforms to a target frequency required. Thus, the clock adjustment circuit 110 doesn't need to dispose an oscillator at least, and the circuit complexity of the clock adjustment circuit 110 may be simplified.

In another exemplary embodiment, the first selection signal sel_1 may also have levels more than 2, or the number of the first selection signal sel_1 is more than 1. The frequency decreasing circuit 114 may select one of the over three different ratios according to the levels of these first selection signals sel1, and may reduce the frequency of the input clock signal clk_in by the selected ratio. As a result, the average frequency of the output clock signal clk_out is also conformed to the target frequency required.

The frequency of the output clock signal clk_out may be changed so that it may have a jitter. Therefore, in an exemplary embodiment, a second clock signal clk_2 generated by the first ratio is transmitted to the digital to analog converting circuit 130. The digital to analog converting circuit 130 may generate the modulation signal according to the second clock signal clk_2 and reduce the jitter accordingly. In another exemplary embodiment, the second clock signal clk_2 is generated according to the second ratio, and the invention is not limited thereto.

Figure 2:
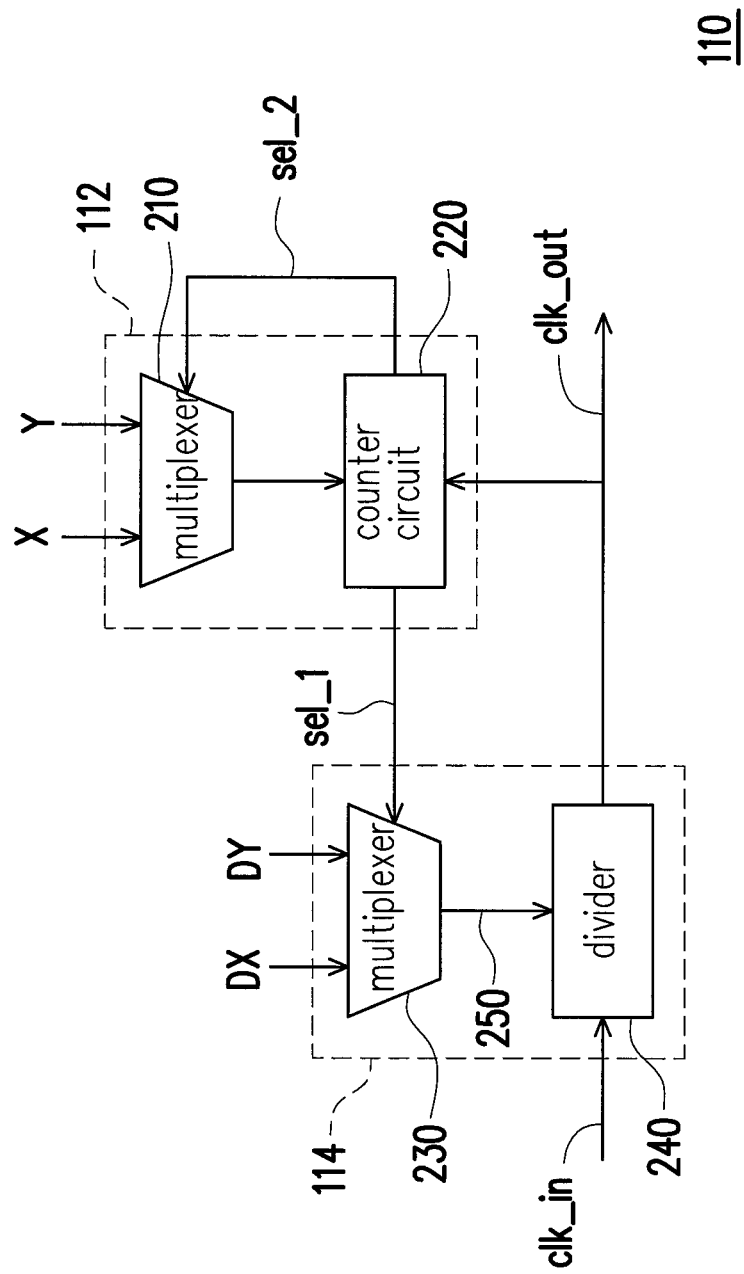
FIG. 2 is a block diagram illustrating a clock adjustment circuit 110 according to an exemplary embodiment of the invention.

FIG. 2 is a block diagram illustrating a clock adjustment circuit 110 according to an exemplary embodiment of the invention.

In the exemplary embodiment of the FIG. 2, the selection circuit 112 includes a counter circuit 220 and a multiplexer 210. The multiplexer 210 is configured to select a first value X or a second value Y according to the second selection signal sel_2, and configured to transmit the first value X or the second value Y selected to the counter circuit 220 as a threshold value. The counter circuit 220 is configured to update a counting value according to the output clock signal clk_out, and configured to determine whether the counting value matches the aforementioned threshold value or not. For example, the counter circuit 220 may detect the edge of the output clock signal clk_out (may be the rising edge or the falling edge) and add the counting value by one while the edge occurs. The counter circuit 220 may decide the first selection signal sel_1 to be at the first level or at the second level according to whether the counting value matches the threshold value or not. For example, if the counting value doesn't conform to the threshold value, the counter circuit 220 maintains the level of the first selection signal sel_1 not to be changed (the level may be the first level or the second level), and if the counting value matches the threshold value, the counter circuit 220 changes the level of the first selection signal sel_1. Besides, the counter circuit 220 also outputs the second selection signal sel_2 according to whether the counting value matches the threshold value or not. For example, if the counting value doesn't conform to the threshold value, the counter circuit 220 maintains the level of the second selection signal sel_2 not to be changed, and if the counting value matches the threshold value, the counter circuit 220 may change the level of the second selection signal sel_2. Thus, when the counting value matches the threshold value, the level of the second selection signal sel_2 is changed, the threshold value is changed accordingly, and the counter circuit 220 resets the counting value at the moment. For details, if the threshold value is the first value X and the counting value of the counter circuit 220 matches the first value X, the counter circuit 220 changes the level of the first selection signal sel_1, resets the counting value, and specifies the second selection signal sel_2 such that the selection circuit 210 selects the second value Y. Besides, if the threshold value is the second value Y and the counting value matches the second value Y, the counter circuit 220 changes the level of the first selection signal sel_1, resets the counting value, and specifies the second selection signal sel_2 such that the multiplexer 210 selects the first value X.

In the exemplary embodiment of the FIG. 2, the frequency decreasing circuit 114 includes a multiplexer 230 and a divider 240. The multiplexer 230 selects the first ratio DX as a ratio signal 250 in response to the first level of the first selection signal sel_1. If the first selection signal sel_1 is at the second level, the multiplexer 230 selects the second ratio DY as the ratio signal 250 in response to the second level of the first selection signal sel_1. The divider 240 reduces the frequency of the input clock signal clk_in according to the ratio signal 250 and generates the output clock signal clk_out accordingly. In an exemplary embodiment, if the counting value of the counter circuit 220 matches the first value X, the counter circuit 220 specifies the first selection signal sel_1 to be at the second level, and the multiplexer 230 selects the second ratio DY accordingly. On the other hand, if the counting value of the counter circuit 220 matches the second value Y, the counter circuit 220 specifies the first selection signal sel_1 to be at the first level, and the multiplexer 230 selects the first ratio DX accordingly.

In another aspect, if the first value X is larger (relative to the second value Y), the time that the divider 240 receives the first ratio DX is longer. By contrast, if the second value Y is larger, the time that the divider 240 receives the second ratio DY is longer. The average frequency of the output clock signal clk_out may be adjusted by adjusting the first value X and the second value Y. In an exemplary embodiment, the first value X, the second value Y, the first ratio DX, and the second ratio DY are determined according to the below equation (1).

$$\left[\frac{1}{\left(\frac{X \times DX}{F_{CLK}} + \frac{Y \times DY}{F_{CLK}}\right) \times \frac{1}{N}}\right] \approx F_d \quad (1)$$

In the equation (1), X is the first value, Y is the second value, DX is the first ratio, and DY is the second ratio. $F_{ax}$ is the frequency of the input clock signal clk_in, N is the sum of the first value X and the second value Y, and $F_d$ is a target frequency. For example, if the frequency of the input clock signal clk_in is 24 MHz (mega hertz), the first value and the second value are equal to each other, the first ratio is 5, and the second ratio is 4, then the target frequency calculated by the equation (1) is about 5.33 MHz. However, the value of the target frequency is not restricted in the invention.

Figure 3:
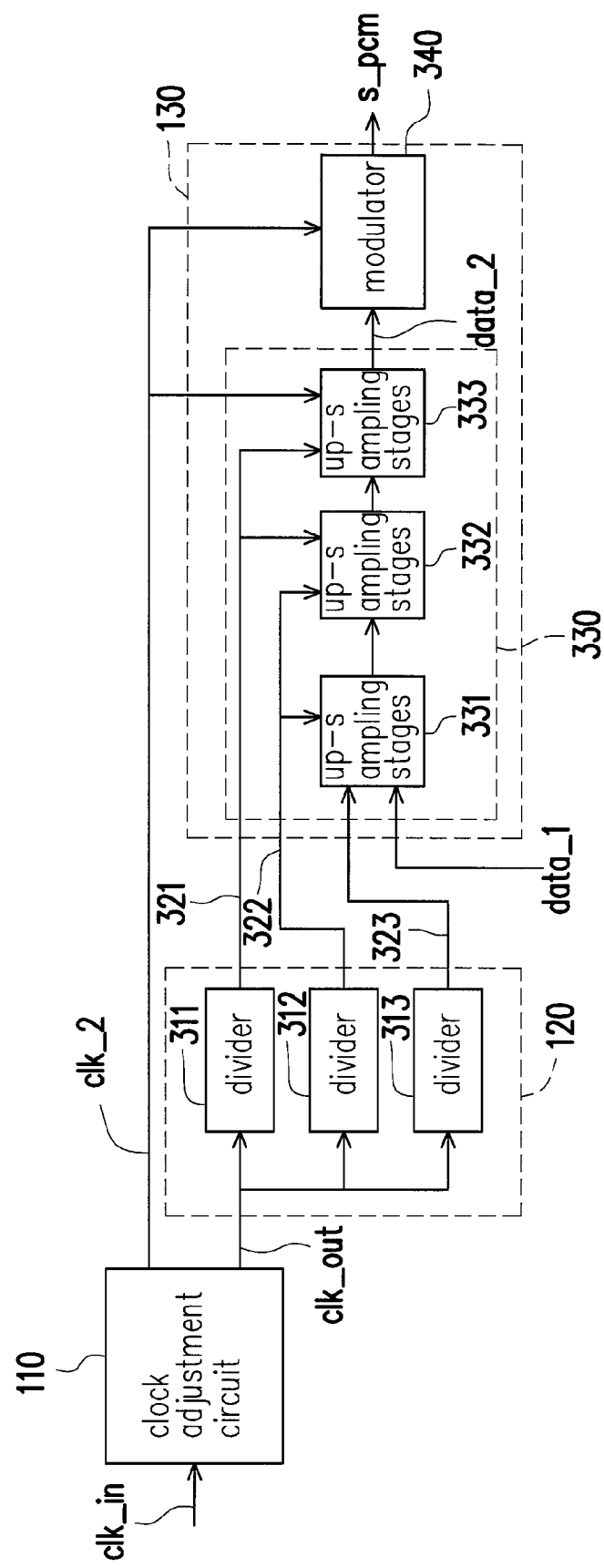
FIG. 3 is a block diagram illustrating a digital to analog converting device according to an exemplary embodiment of the invention.

FIG. 3 is a block diagram illustrating a digital to analog converting device according to an exemplary embodiment of the invention.

In the exemplary embodiment of the FIG. 3, the signal processing circuit 120 includes three dividers 311 to 313, and is configured to generate the first clock signals 321 to 323 by reducing the frequency of the output clock signal clk_out. Wherein the frequencies of the first clock signals 321 to 323 are different from each other. It should be mentioned that the first clock signals 321 to 323 are generated according to the first ratio and the second ratio so that the first clock signals 321 to 323 may have some jitters. The second clock signal clk_2 is only generated according to the first ratio (or the second ratio) so that the second clock signal clk_2 has less jitter.

The digital to analog converting circuit 130 may include a sampling circuit 330 and a modulator 340. The sampling circuit 330, such as an up-sampling circuit in the exemplary embodiment, but not limited thereto, is configured to generate the second digital signal data_2 by up-sampling the first digital signal data_1 according to the first clock signals 321 to 323. The modulator 340 is configured to generate a modulation signal S_pcm by modulating the second digital signal data_2 according to the second clock signal clk_2. For example, the sampling circuit 330 may increase the frequency of the first digital signal data_1 by 128 times, and the modulator 340 is a sigma-delta modulator. However, how many times that the frequency of the first digital signal data_1 is increased is not restricted in the invention, and what kind of the modulation approach adopted by the modulator 340 is not restricted in the invention either. In an exemplary embodiment, the frequency of the second clock signal clk_2 is lower than the frequency of the modulation signal S_pcm, but the invention is not limited thereto.

In an exemplary embodiment, the sampling circuit 330 includes a plurality of up-sampling stages 331 to 333. Each of the up-sampling stages 331 to 333 may include a filter, a switch, or some optional circuits which are configured to perform up-sampling, but the circuits of the up-sampling stages 331 to 333 are not restricted in the invention. Each of the up-sampling stages 331 to 333 up-samples the first digital signal data_1 by several times according to at least one of the first clock signals 321 to 323, and the final stage of the up-sampling stages 331 to 333 (i.e., the up-sampling stage 333) up-samples the first digital signal data_1 according to one of the first clock signals 321 to 323 and the second clock signal clk_2. If multiplying the ratios of the up-sampling stages 331 to 333 together, the ratio required (such as 128) is obtained. For example, the up-sampling stage 331 multiplies the frequency of the first digital signal data_1 by 2 according to the first clock signals 322 and 323, the up-sampling stage 332 multiplies the frequency of the first digital signal data_1 by 4 according to the first clock signals 321 and 322, and the up-sampling stage 333 multiplies the frequency of the first digital signal data_1 by 16 according to the first clock signal 321 and the second clock signal clk_2. Therefore, through the up-sampling stages 331 to 333, the frequency of the first digital signal data_1 is multiplied by 128 as the second digital signal data_2. However, in other exemplary embodiments, the sampling circuit 330 may include more or less up-sampling stages, the number of the up-sampling stage is not limited in the invention, and the ratio of each up-sampling stage is not limited in the invention either.

In summary, the clock adjustment circuit and the digital to analog converting device provided in the exemplary embodiments of the invention may implement an all digital phase lock loop by using the divider and the counter to reduce the complexity of the circuit accordingly. Besides, the low jitter clock signal may be served to perform the modulation to generate the low jitter modulation signal accordingly.

The previously described exemplary embodiments of the present invention have the advantages aforementioned, wherein the advantages aforementioned not required in all versions of the invention.

It will be apparent to those skilled in the art that various modifications and variations may be made to the structure of the invention without departing from the scope or spirit of the invention. In view of the foregoing, it is intended that the invention cover modifications and variations of this invention provided they fall within the scope of the following claims and their equivalents.

What is claimed is:

1. A clock adjustment circuit for generating an output clock signal by tracking an input clock signal, the clock adjustment circuit comprising:

a selection circuit, configured to generate a first selection signal in response to a frequency of the output clock signal; and a frequency decreasing circuit, coupled to the selection circuit, and configured to generate the output clock signal by reducing a frequency of the input clock signal by a first ratio in response to a first level of the first selection signal, and configured to generate the output clock signal by reducing the frequency of the input clock signal by a second ratio in response to a second level of the first selection signal, wherein the first ratio is different from the second ratio.

2. The clock adjustment circuit according to claim 1, wherein the selection circuit comprises:

a counter circuit, configured to update a counting value according to the output clock signal, and configured to determine whether the counting value matches a threshold value or not, wherein the counter circuit is configured to determine the selection signal to be at the first level or the second level according to whether the counting value matches the threshold value or not.

3. The clock adjustment circuit according to claim 2, wherein the counter circuit is further configured to output a second selection signal according to whether the counting value matches the threshold value or not, and the selection circuit further comprises:

a multiplexer, coupled to the counter circuit, and configured to select a first value or a second value according to the second selection signal, and configured to transmit the first value or the second value selected to the counter circuit as the threshold value.

4. The clock adjustment circuit according to claim 3, wherein, if the threshold value is the first value and the counting value matches the first value, the counter circuit specifies the first selection signal to be at the second level, resets the counting value, and specifies the second selection signal such that the multiplexer selects the second value, wherein, if the threshold value is the second value and the counting value matches the second value, the counter circuit specifies the first selection signal to be at the first level, resets the counting value, and specifies the second selection signal such that the multiplexer selects the first value.

5. The clock adjustment circuit according to claim 4, wherein the first value, the second value, the first ratio, and the second ratio are determined according to an equation (1):

$$\left[\frac{1}{\left(\frac{X \times DX}{F_{CLK}} + \frac{Y \times DY}{F_{CLK}}\right) \times \frac{1}{N}}\right] \approx F_d \quad (1)$$

wherein X is the first value, Y is the second value, DX is the first ratio, DY is the second ratio, $F_{CLK}$ is the frequency of the input clock signal, N is a sum of the first value and the second value, and $F_d$ is a target frequency.

6. The clock adjustment circuit according to claim 1, wherein the frequency decreasing circuit comprises:

a multiplexer, coupled to the counter circuit, and configured to select the first ratio as a ratio signal in response to the first level of the first selection signal, and configured to select the second ratio as the ratio signal in response to the second level of the first selection signal; and a divider, coupled to the multiplexer, and configured to receive the ratio signal, and configured to generate the output clock signal by reducing the frequency of the input clock signal according to the ratio signal.

7. A digital to analog converting device, adapted to receive an input clock signal, the digital to analog converting device comprising:

a clock adjustment circuit, comprising:

a selection circuit, configured to generate a first selection signal in response to a frequency of an output clock signal; and a frequency decreasing circuit, coupled to the selection circuit, and configured to generate the output clock signal by reducing a frequency of the input clock signal by a first ratio in response to a first level of the first selection signal, and configured to generate the output clock signal by reducing the frequency of the input clock signal by a second ratio in response to a second level of the first selection signal, wherein the first ratio is different from the second ratio;

a signal processing circuit, coupled to the clock adjustment circuit, and configured to generate at least one first clock signal according to the output clock signal; and a digital to analog converter, coupled to the signal processing circuit, and configured to transform a first digital signal to a modulation signal according to the at least one clock signal.

8. The digital to analog converting device according to claim 7, wherein the selection circuit comprises:

a counter circuit, configured to update a counting value according to the output clock signal, and configured to determine whether the counting value matches a threshold value or not, wherein the counter circuit is configured to determine the selection signal to be at the first level or the second level according to whether the counting value matches the threshold value or not.

9. The digital to analog converting device according to claim 8, wherein the counter circuit is further configured to output a second selection signal according to whether the counting value matches the threshold value or not, and the selection circuit further comprises:

a multiplexer, coupled to the counter circuit, and configured to select a first value or a second value according to the second selection signal, and configured to transmit the first value or the second value selected to the counter circuit as the threshold value.

10. The digital to analog converting device according to claim 9, wherein, if the threshold value is the first value and the counting value matches the first value, the counter circuit specifies the first selection signal to be at the second level, resets the counting value, and specifies the second selection signal such that the multiplexer selects the second value, wherein, if the threshold value is the second value and the counting value matches the second value, the counter circuit specifies the first selection signal to be at the first level, resets the counting value, and specifies the second selection signal such that the multiplexer selects the first value.

11. The digital to analog converting device according to claim 10, wherein the first value, the second value, the first ratio, and the second ratio are determined according to an equation (1):

$$\left[\frac{1}{\left(\frac{X \times DX}{F_{CLK}} + \frac{Y \times DY}{F_{CLK}}\right) \times \frac{1}{N}}\right] \approx F_d \quad (1)$$

wherein X is the first value, Y is the second value, DX is the first ratio, DY is the second ratio, $F_{CLK}$ is the frequency of the input clock signal, N is a sum of the first value and the second value, and $F_d$ is a target frequency.

12. The digital to analog converting device according to claim 7, wherein the frequency decreasing circuit comprises:
a multiplexer, coupled to the counter circuit, and configured to select the first ratio as a ratio signal in response to the first level of the first selection signal, and configured to select the second ratio as the ratio signal in response to the second level of the first selection signal; and
a divider, coupled to the multiplexer, and configured to receive the ratio signal, and configured to generate the output clock signal by reducing the frequency of the input clock signal according to the ratio signal.

13. The digital to analog converting device according to claim 7, wherein the frequency decreasing circuit generates a second clock signal by reducing the frequency of the input clock signal by the first ratio, and the first ratio is larger than the second ratio,
wherein the digital to analog converter comprises:
a sampling circuit, configured to generate a second digital signal by up-sampling the first digital signal according to the at least one first clock signal; and
a modulator, coupled to the sampling circuit, and configured to generate the modulation signal by modulating the second digital signal according to the second clock signal.

14. The digital to analog converting device according to claim 13, wherein the number of the at least one first clock signal is more than 1, and the signal processing circuit includes a plurality of dividers, wherein each of the dividers is configured to generate one of the first clock signals by reducing the frequency of the output clock signal.

15. The digital to analog converting device according to claim 14, wherein the sampling circuit includes a plurality of up-sampling stages, wherein each of the up-sampling stages up-samples the first digital signal according to at least one of the first clock signals, and a final stage of the up-sampling stages generates the second digital signal by up-sampling the first digital signal according to one of the first clock signals and the second clock signal.

16. The digital to analog converting device according to claim 13, wherein the frequency of the second clock signal is lower than a frequency of the modulation signal.

* * * * *